(12) United States Patent
Chang et al.

(10) Patent No.: US 8,848,461 B2
(45) Date of Patent: Sep. 30, 2014

(54) MEMORY CELL HAVING FLEXIBLE READ/WRITE ASSIST AND METHOD OF USING

(75) Inventors: Jonathan Tsung-Yung Chang, Hsinchu (TW); Kun-Hsi Li, Hsinchu (TW); Chiting Cheng, Taichung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 327 days.

(21) Appl. No.: 13/464,489

(22) Filed: May 4, 2012

(65) Prior Publication Data

US 2013/0294181 A1    Nov. 7, 2013

(51) Int. Cl.
*G11C 7/22* (2006.01)

(52) U.S. Cl.
USPC ................ 365/189.05; 365/154; 365/189.15; 365/189.16

(58) Field of Classification Search
CPC ....... G11C 7/1051; G11C 7/1078; G11C 7/22
USPC ........... 365/189.05, 154, 201, 189.15, 189.16
See application file for complete search history.

(56) References Cited

U.S. PATENT DOCUMENTS

| | | | |
|---|---|---|---|
| 5,652,175 | A | 7/1997 | Chen et al. |
| 7,701,755 | B2 * | 4/2010 | Chen et al. .................... 365/154 |
| 8,004,907 | B2 * | 8/2011 | Russell et al. ......... 365/189.011 |
| 8,098,533 | B2 * | 1/2012 | Nii et al. .................. 365/189.11 |

* cited by examiner

*Primary Examiner* — Son Dinh
(74) *Attorney, Agent, or Firm* — Lowe Hauptman & Ham, LLP

(57) ABSTRACT

A semiconductor device includes at least one memory cell die. The at least one memory cell die includes a data storage unit. The at least one memory cell die includes at least one read assist enabling unit electrically connected to the data storage unit. The at least one read assist enabling unit configured to lower a voltage of a word line. The memory cell die also includes at least one write assist enabling unit electrically connected to the data storage unit. The at least one write assist enabling unit configured to supply a negative voltage to at least one of a bit line or a bit line bar.

20 Claims, 3 Drawing Sheets

MEMORY CELL HAVING FLEXIBLE READ/WRITE ASSIST AND METHOD OF USING

BACKGROUND

Memory cell dies are formed by patterning a wafer. In some instances, a single patterned wafer contains thousands of memory cell dies. During a manufacturing process, variations occur between different memory cell dies on the wafer, as well as between different wafers. While many of the memory cell dies pass quality control standards, some of the memory cell dies exhibit an unacceptable functionality during read or write operations.

Unacceptable functionality during a read operation is termed read disturb. Read disturb is a result of a change in a threshold voltage of transistors in a memory cell die which in some instances causes the read operation to produce a value opposite to the actual stored value. In order to reduce read disturb to an acceptable level, a word line of the memory cell die is underdriven to a value below an operating voltage. This underdriving is called read assist. However, cells equipped with read assist exhibit a reduced switching speed. In some instances, the switching speed is reduced by about 27%.

In addition to read assist, some memory cell dies are enabled with write assist functionality, in order to pass quality control tests. Write assist is achieved by providing a negative charge on a bit line. The negative charge on the bit line allows the memory cell die to function at a lower operating voltage. However, the write assist functionality increases power consumption of the memory cell die because a voltage supply is used to negatively charge the bit line.

Memory cell die manufacturers either accept a lower production yield or enable every memory cell die on the wafer with read assist or write assist functionality. Enabling every memory cell die with read assist functionality reduces the switching speed of all the memory cell dies, even those having acceptable read operations. Enabling every memory cell die with write assist functionality increases the power consumption of all the memory cell dies, even those having acceptable write operations.

DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
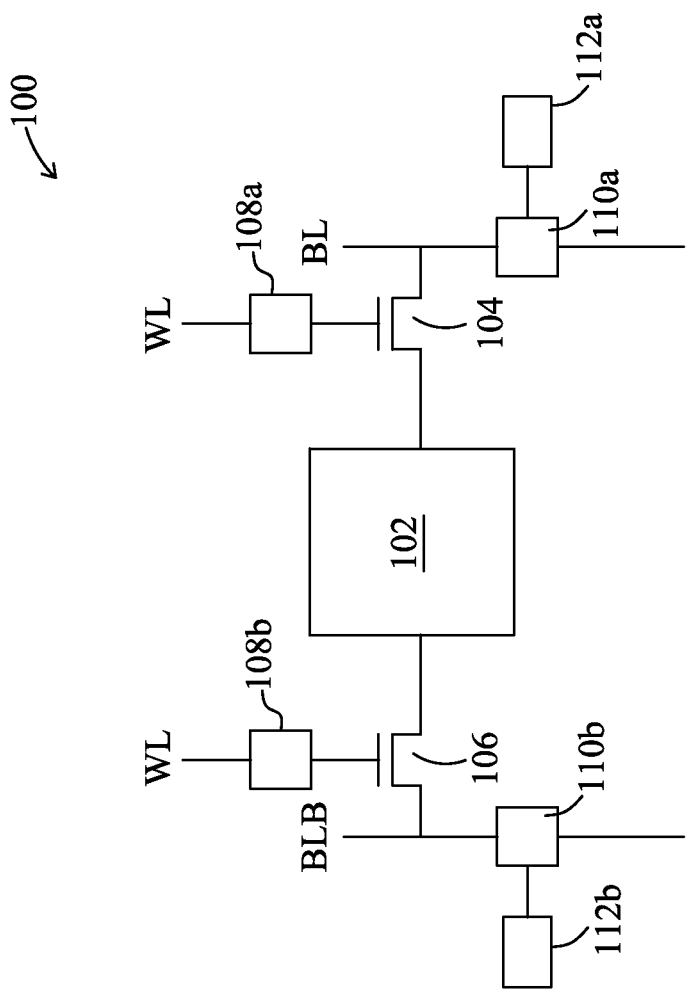
FIG. 1 is a high level schematic diagram of a memory cell die according to one or more embodiments.

FIG. 1 is a high level schematic diagram of at least a portion of a memory cell die 100. Memory cell die 100 includes a data storage unit 102 configured to store non-transitory computer-readable datum. Data storage unit 102 is electrically connected to a first transistor 104 and a second transistor 106. A gate of first transistor 104 is electrically connected to a first read assist enabling unit 108a by a word line WL. The word line WL passes through first reason assist enabling unit 108a. A gate of second transistor 106 is electrically connected to a second read assist enabling unit 108b by the word line WL. The word line WL passes through second read assist enabling unit 108b. A source or drain of first transistor 104 is also electrically connected to a bit line BL. The bit line BL is electrically connected to a first write assist enabling unit 110a. The bit line BL passes through first write assist enabling unit 110a. A source or a drain of second transistor 106 is also electrically connected to a bit line bar BLB. The bit line bar BLB is a complementary value of the bit line BL. The bit line bar BLB is electrically connected to a second write assist enabling unit 110b. The bit line bar BLB passes through second write assist enabling unit 110b. First write assist enabling unit 110a is electrically connected to a first negative voltage supply 112a. Second write assist enabling unit 110b is electrically connected to a second negative voltage supply 112b.

Data storage unit 102 is configured to store non-transitory computer-readable datum. Data storage unit 102 is configured to output the stored datum during a read operation. In some embodiments, data storage unit 102 is configured to alter stored information during a write operation. In some embodiments, data storage unit 102 is a random-access memory (RAM) type memory cell such as a dynamic-RAM (DRAM), a static-RAM (SRAM), or other suitable RAM type memory cell. In some embodiments, data storage unit 102 is a read-only memory (ROM) type memory cell such as an erasable programmable ROM (EPROM), an electrically erasable ROM (EEROM), or other suitable ROM type memory cell. In some embodiments, data storage unit 102 is a flash memory type memory cell.

First transistor 104 and second transistor 106 are electrically connected to opposite sides of data storage unit 102. First transistor 104 and second transistor 106 are configured to control a voltage level of signals into and out of data storage unit 102. In some embodiments, first transistor 104 and second transistor 106 are n-type metal-oxide-semiconductor (NMOS) transistors. In some embodiments, first transistor 104 and second transistor 106 are p-type metal-oxide-semiconductor (PMOS) transistors. During the read operation, a voltage is applied by the word line WL to the gate of first transistor 104 and the gate of second transistor 106. The datum stored in data storage unit 102 is then transferred to the bit line BL and the bit line bar BLB. During the write operation, the bit line BL and the bit line bar BLB are pre-charged. Then, the voltage applied by the word line WL to the gates of first and second transistors 104 and 106 allows the charge from the bit line BL and the bit line bar BLB to transfer into data storage unit 102.

First and second read assist enabling units 108a and 108b facilitate a reduction in the voltage applied by the word line WL to the gates of first and second transistors 104 and 106. By reducing the voltage applied by the word line WL, the effects of read disturb are reduced. In some embodiments, first and second read assist enabling units 108a and 108b are combined into a single read assist enabling unit. In some embodiments, the reduction in the voltage applied by the word line WL ranges from 5% to 20% of an operating voltage. In some embodiments, the reduction in the voltage applied by the word line WL ranges from 5% to 10% of the operating voltage.

In some embodiments, first and second read assist enabling units 108a and 108b are fuses. Fuses are used in integrated circuits as a means for breaking connections under controlled conditions. In some embodiments, the fuses comprise a length of a conductive material such as metal or heavily doped silicon. In some embodiments, the fuses are activated by applying a sufficiently high voltage level to the fuses. In some embodiments, the fuses are activated by applying laser light to the fuses.

In some embodiments, first and second read assist enabling units 108a and 108b are switches. In some embodiments, the switches are controlled using a dynamic control circuit to selectively activate and de-activate the switches. In some embodiments, the dynamic control circuit allows the read assist functionality to be turned on when and turned off when depending on whether the data storage unit 102 currently experiences read disturb. In some embodiments, the switches are controlled by a static control device which permanently activates the switches a single time.

First and second write assist enabling units 110a and 110b enabling application of a negative voltage to the bit line BL and the bit line bar BLB during the write operation. First and second write assist enabling units 110a and 110b enable application of the negative voltage by connecting the bit line BL and the bit line bar BLB to first and second negative power supplies 112a and 112b. By applying the negative voltage to the bit line BL and the bit line bar BLB, a threshold voltage to activate first and second transistors 104 and 106 is reduced. The reduced threshold voltage increases the switching speed of transistor which allows overwriting of the information stored in data storage unit 102 in a shorter period of time. In some embodiments, first and second write assist enabling units 110a and 110b are combined into a single write assist enabling unit. In some embodiments, the negative voltage applied to the bit line BL and the bit line bar BLB ranges from 0.03 V to 0.4 V.

In some embodiments, first and second write assist enabling units 110a and 110b are fuses. In some embodiments, the fuses comprise a length of a conductive material such as metal or heavily doped silicon. In some embodiments, the fuses are activated by applying a sufficiently high voltage level to the fuses. In some embodiments, the fuses are activated by applying laser light to the fuses.

In some embodiments, first and second write assist enabling units 110a and 110b are switches. In some embodiments, the switches are controlled using a dynamic control circuit to selectively activate and de-activate the switches. In some embodiments, the dynamic control circuit allows the write assist functionality to be turned on and turned off, depending on whether increased switching speed of transistors 104 and 106 is necessary, for example, when the datum stored in data storage unit 102 is utilized along a critical circuit path. In some embodiments, the switches are controlled by a static control device which permanently activates the switches a single time.

In some embodiments, first and second write assist enabling units 110a and 110b are switches and first and second read assist enabling units 108a and 108b are fuses. In some embodiments, first and second write assist enabling units 110a and 110b are fuses and first and second read assist enabling units 108a and 108b are switches. In some embodiments, first and second write assist enabling units 110a and 110b are fuses and first and second read assist enabling units 108a and 108b are fuses. In some embodiments, first and second write assist enabling units 110a and 110b are switches and first and second read assist enabling units 108a and 108b are switches.

Following activation of first and second write assist enabling units 110a and 110b, first and second negative voltage supplies 112a and 112b are configured to supply a voltage level to the bit line BL and the bit line bar BLB below a reference ground voltage level. In some embodiments, first and second negative voltage supplies 112a and 112b comprise a positive-to-negative converter, a cap coupling negative voltage booster, or a voltage regulator.

Figure 2:
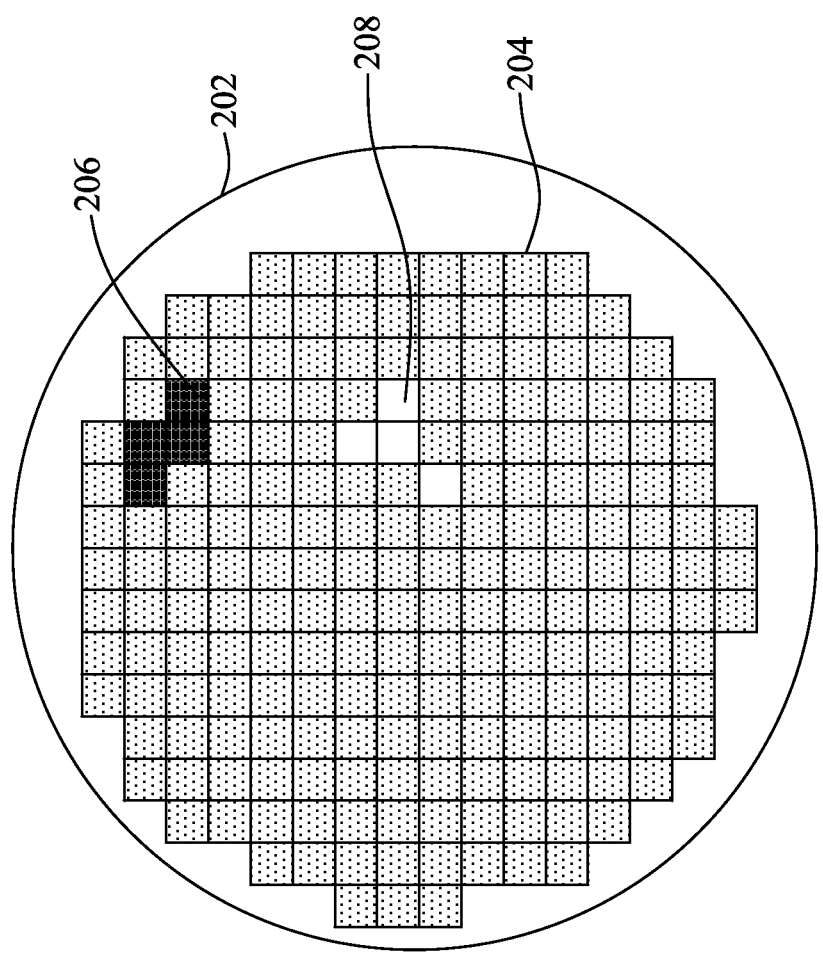
FIG. 2 is a top view of a wafer having a plurality of memory cell dies according to one or more embodiments.

During a manufacturing process, a plurality of memory cell dies 100 is formed on a wafer. FIG. 2 is a top view of a wafer 202 having a plurality of memory cell dies 204, 206 and 208 formed thereon. In the embodiment of FIG. 2, memory cell dies 204 satisfy quality control tests without the need for read assist or write assist. In some embodiments, quality control testing includes using a probe to measure the voltage of the word line WL applied to the gate of the first and second transistors 104 and 106. In some embodiments, quality control testing includes using a probe to determine switching speed of first and second transistors 104 and 106. In some embodiments, the switching speed is determined based on a pulse width of one write cycle.

In the embodiment of FIG. 2, memory cell dies 206 require read assist to satisfy quality control tests. Enabling read assist in memory cell dies 206 reduces the switching speed of memory cell dies 206. However, because memory cell dies in an FS corner exhibit the worst read disturb, reducing the speed of memory cell dies 206 will not cause memory cell dies 206 to fail the speed quality control test. The memory cell die in the FS corner refers to the n-type transistors having a fast switching speed and p-type transistors having a slow switching speed. Due to the switching speed of the n-type transistors, memory cell dies 206 will continue to pass quality control tests for speed even after the switching speed reduction associated with enabling read assist.

An acceptable difference between the voltage of the word line WL and the operating voltage is specified by a circuit designer. In some embodiments, if the voltage of the word line WL is 80% or less of the operating voltage, read assist is enabled to reduce read disturb. In some embodiments, if the voltage of the word line WL is 90% or less of the operating voltage, read assist is enabled to reduce read disturb.

In the embodiment of FIG. 2, memory cell dies 208 require write assist to satisfy quality control tests. Enabling write assist in memory cell dies 208 increases the switching speed of memory cell dies 208. However, because the bit line BL and the bit line bar BLB are pre-charged with a negative voltage, power consumption of the memory cell die increases. Memory cell dies in the SF corner are more likely to require write assist to pass quality control tests than other types of memory cell dies. The memory cell die in the SF corner refers to the n-type transistors having a slow switching speed and p-type transistors having a fast switching speed. In some embodiments, write assist is enabled when the voltage of the word line WL is less than 90% of the operating voltage. In some embodiments, write assist is enabled when the voltage of the word line WL is less than 80% of the operating voltage. In some embodiments, write assist is enabled when the voltage of the word line WL is less than 70% of the operating voltage. The determination of an acceptable voltage of word line WL is based on specifications from the circuit designer.

Figure 3:
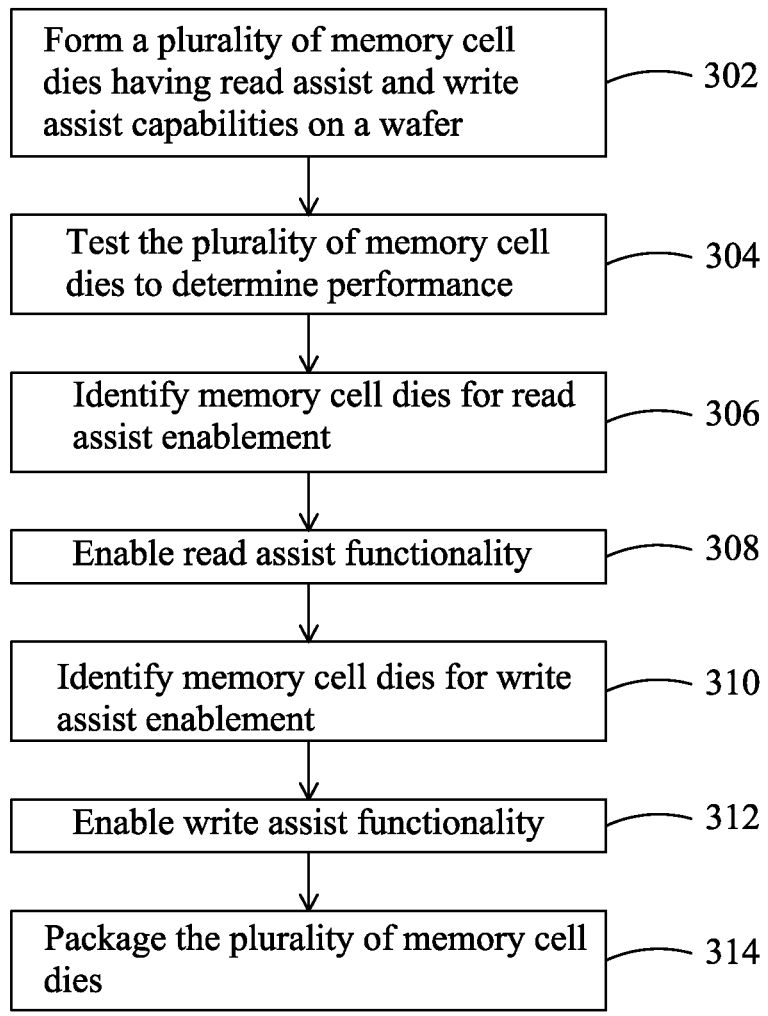
FIG. 3 is a flowchart of a method of enabling read assist or write assist in a memory cell die according to one or more embodiments.

FIG. 3 is a flowchart of a method 300 of enabling read assist or write assist in a memory cell die. In operation 302, a plurality of memory dies having read assist and write assist capabilities is formed on a wafer. In some embodiments, the plurality of memory cell dies is formed using a photolithography process or other suitable formation process. The read assist capability is included by forming first and second read assist enabling units 108a and 108b connected to a data storage unit 102. The write assist capability is included by forming first and second write assist enabling units 110a and 110b connected to a data storage unit 102.

In operation 304, each of the plurality of memory cell dies is tested to determine performance of each of the plurality of memory cell dies. In some embodiments, a probe is used to test each of the plurality of memory cell dies. In some embodiments, a test circuit is formed in the same die as the memory cell and the test circuit is used to test each of the plurality of memory cell dies. In some embodiments, a value of a voltage level applied by the word line WL to the gate of first and second transistors 104 and 106 is tested during operation 304.

In operation 306, memory cell dies for read assist enablement are identified. Memory cells dies having a voltage applied by the word line WL to the gates of first and second transistors 104 and 106 below a predetermined value are identified as requiring read assist functionality. In some embodiments, the predetermined value is 90% or less of the operating voltage. In some embodiments, the predetermined value is 80% or less of the operating voltage.

In operation 308, read assist functionality is enabled in the memory cell dies identified in operation 306. In some embodiments where first and second read assist enabling units 108a and 108b are fuses, read assist is enabled by breaking the fuses. In some embodiments, the fuses are broken by applying a sufficiently high voltage level to the fuses. In some embodiments, the fuses are broken by illuminating the fuses with laser light. In some embodiments where first and second read assist enabling units 108a and 108b are switches, the switches are activated by a control circuit. In some embodiments, the control circuit is capable of activating and deactivating the switches. In some embodiments, the control circuit is capable of permanently activating the switches.

In operation 310, memory cell dies for write assist enablement are identified.

In operation 312, write assist functionality is enabled in the memory cell dies identified in operation 310. In some embodiments where first and second write assist enabling units 110a and 110b are fuses, write assist is enabled by breaking the fuses. In some embodiments, the fuses are broken by applying a sufficiently high voltage level to the fuses. In some embodiments, the fuses are broken by illuminating the fuses with laser light. In some embodiments where first and second write assist enabling units 110a and 110b are switches, the switches are activated by a control circuit. In some embodiments, the control circuit is capable of activating and deactivating the switches. In some embodiments, the control circuit is capable of permanently activating the switches. In some embodiments, some memory cell dies are enabled with both read assist and write assist.

In operation 314, each of the plurality of memory cell dies are packaged into semiconductor devices. In some embodiments, the semiconductor devices include logic circuits, process, memory array or other suitable semiconductor devices. In some embodiments, the plurality of memory cell dies are packaged prior to enabling read assist or write assist. In some embodiments, read assist or write assist is enabled prior to packaging the plurality of memory cell dies.

By selectively enabling read assist or write assist, the number of dies which pass quality control tests is increased resulting in a higher production yield. The higher production yield in turn reduces production cost because fewer memory cell dies are discarded as failing to pass quality control tests.

In addition, the ability to enable write assist in selected memory cell dies while maintaining normal operation in other memory cell dies, reduces the amount of power consumption of an array of memory cell dies. The speed of the dies which are not read assist enabled also maintains the higher switching speed. These factors result in higher performance of devices which include the memory cell dies described above as compared to a wafer assembly which enable read assist or write assist for every memory cell formed on the wafer assembly.

One aspect of this invention relates to a semiconductor device including a memory cell die. The memory cell die includes a data storage unit. The memory cell die includes at least one read assist enabling unit electrically connected to the data storage unit, the at least one read assist enabling unit configured to lower the voltage of a word line. The memory cell die also includes at least one write assist enabling unit electrically connected to the data storage unit, the at least one write assist enabling unit configured to apply a negative voltage to at least one of a bit line or a bit line bar.

Another aspect of this invention relates to a semiconductor wafer including a plurality of memory cell dies. Each of the plurality of memory cell dies includes a data storage unit. Each of the plurality of memory cell dies includes at least one read assist enabling unit electrically connected to the data storage unit, the at least one read assist enabling unit configured to lower the voltage of a word line. Each of the plurality of memory cell dies also includes at least one write assist enabling unit electrically connected to the data storage unit, the at least one write assist enabling unit configured to apply a negative voltage to at least one of a bit line or a bit line bar.

Still another aspect of this invention relates to a method of enabling read assist or write assist including forming at least one memory cell die. The at least one memory cell die includes a data storage unit. The at least one memory cell die includes at least one read assist enabling unit electrically connected to the data storage unit, the at least one read assist enabling unit configured to lower the voltage of a word line. The at least one memory cell die also includes at least one write assist enabling unit electrically connected to the data storage unit, the at least one write assist enabling unit configured to apply a negative voltage to at least one of a bit line or a bit line bar. The method further includes determining a performance of the at least one memory cell die. The method also includes selectively activating the at least one read assist enabling unit or the at least one write assist enabling unit, base on the performance of the at least one memory cell die.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
   at least one memory cell die, wherein the at least one memory cell die comprises:
   a data storage unit;
   at least one read assist enabling unit electrically connected to the data storage unit, the at least one read assist enabling unit configured to lower a voltage of a word line; and at least one write assist enabling unit electrically connected to the data storage unit, the at least one write assist enabling unit configured to apply a negative voltage to at least one of a bit line or a bit line bar.

2. The semiconductor wafer of claim 1, wherein the at least one read assist enabling unit comprises a fuse.

3. The semiconductor wafer of claim 1, wherein the at least one write assist enabling unit comprises a fuse.

4. The semiconductor wafer of claim 1, wherein the at least one read assist enabling unit comprises a switch.

5. The semiconductor wafer of claim 1, wherein the at least one write assist enabling unit comprises a switch.

6. A semiconductor wafer comprising:
   a plurality of dies, each of the plurality of dies comprising:
      a data storage unit;
      at least one read assist enabling unit electrically connected to the data storage unit, the at least one read assist enabling unit configured to lower a voltage of a word line; and
      at least one write assist enabling unit electrically connected to the data storage unit, the at least one write assist enabling unit configured to supply a negative voltage to at least one of a bit line or a bit line bar.

7. The semiconductor wafer of claim 6, wherein the at least one read assist enabling unit comprises a fuse.

8. The semiconductor wafer of claim 6, wherein the at least one write assist enabling unit comprises a fuse.

9. The semiconductor wafer of claim 6, wherein the at least one read assist enabling unit comprises a switch.

10. The semiconductor wafer of claim 6, wherein the at least one write assist enabling unit comprises a switch.

11. The semiconductor wafer of claim 6, further comprising:
    at least one first die selected from the plurality of dies, wherein the at least one read assist enabling unit is activated for the at least one first die; and
    at least one second die selected from the plurality of dies, wherein the at least one write assist enabling unit is activated for the at least one second die.

12. The semiconductor wafer of claim 11, wherein a number of the at least one first die added to a number of the at least one second die is less than a number of dies in the plurality of dies.

13. A method of enabling read assist or write assist comprising:
    forming at least one memory cell die, wherein the memory cell die comprises:
       a data storage unit
       at least one read assist enabling unit electrically connected to the data storage unit, the at least one read assist enabling unit configured to lower a voltage of a word line; and
       at least one write assist enabling unit electrically connected to the data storage unit, the at least one write assist enabling unit configured to supply a negative voltage to at least one of a bit line or a bit line bar;
    determining a performance of the at least one memory cell die; and
    selectively activating at least one of the at least one read assist enabling unit or the at least one write assist enabling unit based on the performance of the at least one memory cell die.

14. The method of claim 13, wherein the testing the at least one memory cell die comprises determining a voltage of a word line, and the at least one read assist enabling unit is activated based on the determined voltage of the word line.

15. The method of claim 14, wherein the at least one read assist enabling unit is activated if the determined voltage of the word line is less than 80% of an operating voltage of the memory cell die.

16. The method of claim 13, wherein selectively activating the at least one read assist enabling unit or the at least one write assist enabling unit comprises blowing a fuse.

17. The method of claim 13, wherein the selectively activating the at least one read assist enabling unit or the at least one write assist enabling unit comprises closing a switch.

18. The method of claim 17, wherein the closing the switch comprises closing the switch based on a signal received from a control circuit.

19. The method of claim 13, wherein the forming the at least one memory cell die comprises forming a plurality of memory cell dies on a semiconductor wafer, and the testing the memory cell die comprises testing each of the plurality of memory cell dies.

20. The method of claim 19, wherein the selectively activating the at least one read assist enabling unit or the at least one write assist enabling unit comprises:
    activating the at least one read assist enabling unit for at least one first die of the plurality of dies; and
    activating the at least one write assist enabling unit for at least one second die of the plurality of dies,
    wherein a sum of a number of the at least one first die and a number of the at least one second die is less than a number of dies in the plurality of dies.

* * * * *